(12) United States Patent
Bozkaya et al.

(10) Patent No.: US 7,051,304 B2
(45) Date of Patent: May 23, 2006

(54) DISTRIBUTED INFINIBAND VERIFICATION PROTOCOL

(75) Inventors: Ali Bozkaya, Oslo (NO); Morten Schanke, Oslo (NO)

(73) Assignee: Sun Microsystems, Inc., Santa Clara, CA (US)

( * ) Notice: Subject to any disclaimer, the term of this patent is extended or adjusted under 35 U.S.C. 154(b) by 468 days.

(21) Appl. No.: 10/428,368

(22) Filed: May 1, 2003

(65) Prior Publication Data

US 2004/0221251 A1 Nov. 4, 2004

(51) Int. Cl.
G06F 17/50 (2006.01)
(52) U.S. Cl. .............................. 716/5; 716/4
(58) Field of Classification Search ............... 716/2–6, 716/18
See application file for complete search history.

(56) References Cited

U.S. PATENT DOCUMENTS

| | | | |
|---|---|---|---|
| 6,625,764 B1 * | 9/2003 | Dawson | 714/715 |
| 6,856,950 B1 * | 2/2005 | Abts et al. | 703/13 |
| 2002/0169815 A1 * | 11/2002 | Wong et al. | 709/100 |
| 2005/0039079 A1 * | 2/2005 | Higashi et al. | 714/28 |
| 2005/0198606 A1 * | 9/2005 | Gupta et al. | 716/18 |

OTHER PUBLICATIONS

Angstadt, R., et al: "The design of a hardware testing system for the D Zero detector" Proceedings of the Nuclear Science Symposium and Medical Imaging Conference. Santa Fe, Nov. 2-9, 19991, New York, IEEE, US, vol. 1, Nov. 2, 1991, pp. 719-722, XP0100058007, ISBN: 0-7803-0513-2.
Fin, A., et al: "The use of systemc for design verification and integration test of IP-cores" ASIC-SOC Conference Proceedings 2001 IEEE, Sep. 12, 2001, pp. 76-80, SP010560759.

(Continued)

*Primary Examiner*—Stacy A. Whitmore
*Assistant Examiner*—Binh Tat
(74) *Attorney, Agent, or Firm*—Park, Vaughan & Fleming LLP

(57) ABSTRACT

A verification process comprises a verification environment having a hardware development language interface. The verification process also comprises a device under test having a hardware development language interface operable to communicate with the verification environment hardware development language interface, and also having an Infiniband interface. The verification process additionally comprises a remote Infiniband link having an Infiniband interface operable to communicate with the device under test Infiniband interface and also having a socket protocol interface operable to communicate with a further verification process.

46 Claims, 8 Drawing Sheets

OTHER PUBLICATIONS

Wong, W: "Network-based debugging: Internet appliances in the wild" Electronic Design Penton Media USA, vol. 49, No. 5, Mar. 5, 2001, p. 116, 118, 120, 122, XP002300821 ISSN: 0013-4872.

International Bureau, International Preliminary Report on Patentability, Nov. 17, 2005, 8 pages, for International Application No. PCT/US2004/013635, which claims priority to and is substantially identical to U.S. Appl. No. 10/428,368.

The UK Patent Office, Examination Report under Section 18(3), Aug. 19, 2005, 1 page, for UK Patent Application No. GB0424634.4, which claims priority to and is substantially identical to U.S. Appl. No. 10/428,368.

* cited by examiner

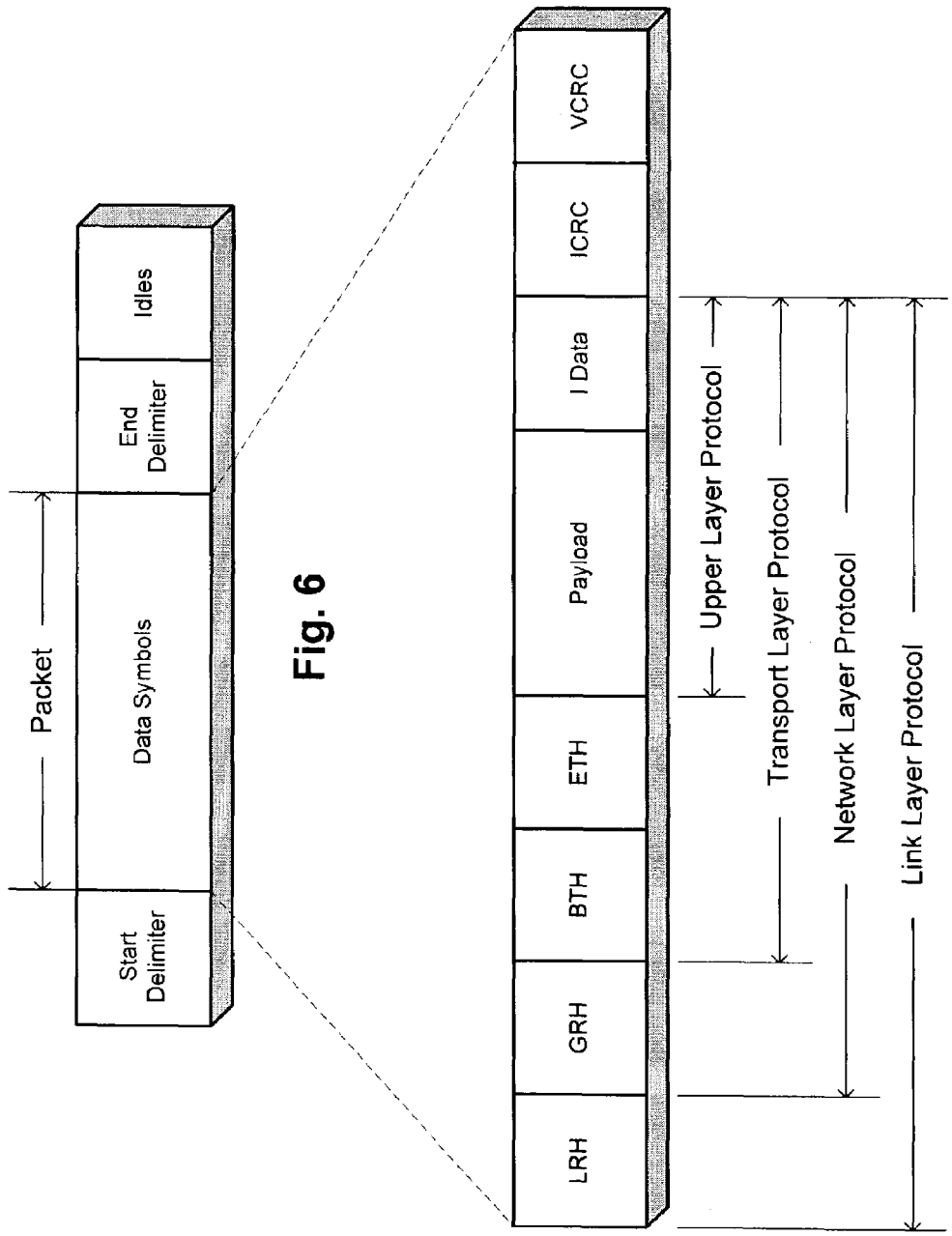

DISTRIBUTED INFINIBAND VERIFICATION PROTOCOL

The present invention relates to test and verification systems, and in particular but not exclusively to arrangements for a distributed Infiniband™ verification system.

INTRODUCTION

In the field of testing hardware designs there is often a need to simulate together two designs making up a larger design, or two parts of a single design. Such co-ordinated simulation is hampered by the fact that the two design parts may be developed by different groups of persons having different development practices and using different development languages. Thus, compiling and executing such a combination in a unified test environment is a non-trivial operation. Also, the groups of developers may be geographically separated by some distance and/or the total size of the combined design may be too large to effectively simulate on a single computer system. Thus, the simulation environment may be spread over more than one computer system at more than one geographical location.

SUMMARY OF THE INVENTION

The present invention has been made, at least in parts, in consideration of the above identified problems and drawbacks of conventional systems.

Viewed from a first aspect, the present invention provides a verification process which comprises a verification environment having a hardware development language interface. The verification process also comprises a device under test having a hardware development language interface operable to communicate with the verification environment hardware development language interface and also having an Infiniband interface. The verification process additionally comprises a remote Infiniband link having an Infiniband interface operable to communicate with the device under test Infiniband interface and also having a socket protocol interface operable to communicate with a further verification process. This arrangement provides a verification process operable to function co-operatively with other verification processes in an environment de-coupled and efficient manner.

Viewed from a second aspect, the present invention provides a distributed simulation environment which comprises a first verification process as set out above and a second verification process as set out above. The distributed simulation environment also comprises a socket connection arranged to connect the remote Infiniband link socket protocol interface of each verification process. This arrangement provides a simulation environment where an environment de-coupled distributed testing of a design may be performed in an efficient manner.

Viewed from a third aspect, the present invention provides a method of distributed testing of a hardware design. The method comprises firstly providing a stimulus to a first part of the design to produce an initial result. Secondly, transmitting the initial result via a first Infiniband interface to a first socket connection interface. Thirdly, transmitting the initial result via a socket connection from the first socket connection interface to a second socket connection interface. Then transmitting the initial result from the second socket connection interface to a second Infiniband interface. Then transmitting the initial result from the second Infiniband interface to a second part of the design and finally processing the initial result at the second part of the design to produce a further result. This method provides that a simulation of a design may take place in a distributed fashion, without reference to environment specific factors of any part of the design relative to another part.

These and other aspects of the present invention will become clear from the following description and appended claims.

BRIEF DESCRIPTION OF FIGURES

Specific embodiments of the present invention will now be described by way of example only, with reference to the accompanying figures in which:

FIG. 6 shows schematically the structure of a message to be transmitted via an Infiniband™ Architecture;

FIG. 7 shows schematically the format of a packet of the message of FIG. 6;

DESCRIPTION OF SPECIFIC EMBODIMENTS

A particular computer networking architecture is the Infiniband™ architecture. Infiniband™ is a standard architecture defined and administered by the Infiniband™ Trade Association, which was founded by Compaq, Dell, Hewlett-Packard, IBM, Intel, Microsoft and Sun Microsystems. The Infiniband™ Architecture defines a System Area Network (SAN) for connecting multiple independent processor platforms (i.e. host processor nodes), I/O platforms and I/O devices. A full definition of the Infiniband™ Architecture may be found in the Infiniband™ Architecture Specification Volumes 1 and 2, available from the Infiniband™ Trade Association. Infiniband™ defines a standard for flexible and high-speed interconnect between computing systems or parts of a computing system such as a processor and I/O nodes. Infiniband™ allows an order of magnitude increase in flexibility and scalability compared to conventional bus based systems through a highly hardware coupled and low latency interface, which is a key factor in multiprocessing architectures.

The Infiniband™ Architecture SAN is a communications and management infrastructure supporting both I/O and interprocessor communications for one or more computer systems. An Infiniband™ Architecture system can range from a small server with one processor and a few I/O devices to a massively parallel supercomputer installation with hundreds of processors and thousands of I/O devices.

The Infiniband™ Architecture defines a switched communications fabric allowing many devices to concurrently communicate with high bandwidth and low latency in a protected, remotely managed environment. An endnode can communicate over multiple Infiniband™ Architecture ports and can utilise multiple paths through the Infiniband™ Architecture fabric. A multiplicity of Infiniband™ Architecture ports and paths through the network are provided for both fault tolerance and increased data transfer bandwidth.

Infiniband™ Architecture hardware off-loads from the CPU much of the I/O communications operation. This allows multiple concurrent communications without the traditional overhead associated with communicating protocols. The Infiniband™ Architecture SAN provides its I/O and interprocessor communications clients zero processor-copy data transfers, with no kernel involvement, and uses hardware to provide highly reliable, fault tolerant communications.

Figure 1:
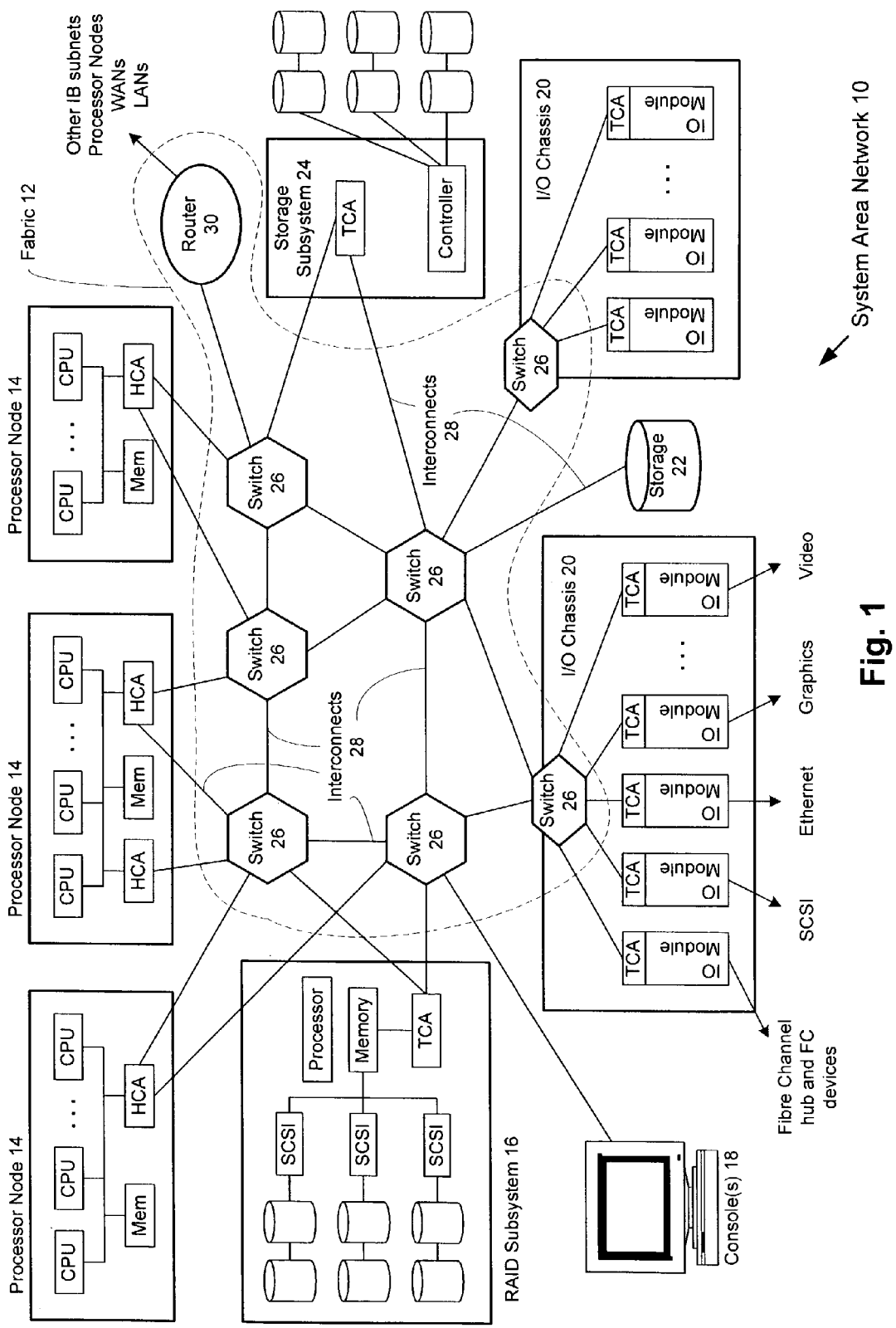
FIG. 1 is a schematic block diagram showing an example of interconnection of computing system elements via the Infiniband™ networking architecture.

An example of an Infiniband™ Architecture System Area Network is shown in FIG. 1. As can be seen from FIG. 1, a System Area Network 10 comprises an Infiniband™ Architecture fabric (or Subnet) 12 made up of cascaded switches and routers. The fabric 12 provides links between a number of processor nodes 14 and other nodes including a RAID Subsystem 16, consoles 18, I/O Chassis 20, Storage 22 and a Storage Subsystem 24. The fabric 12 is made up of a plurality of switches 26 having interconnections 28 providing data connections between the nodes attached to the fabric 12. Also included in the fabric 12 is a router 30 for providing connections to and from other networks, which may be other Infiniband™ Architecture subnets, non-Infiniband™ Architecture LANs and WANs, processor nodes, and/or other entities. I/O units connected via the fabric 12 may range in complexity from single ASIC (Application-Specific Integrated Circuit) devices such as a SCSI (Small Computer Systems Interface) or LAN adapter, to large memory-rich RAID subsystems that rival a processor node in complexity. Collectively, the processor nodes 14, RAID subsystems 16, consoles 18, I/O chassis 20, storage 22 and storage subsystems 24 are known as endnodes 32.

Each endnode 32 includes a Channel Adapter, which may be a Host Channel Adapter (HCA) or a Target Channel Adapter (TCA). Host Channel Adapters are found in processor nodes 14, and Target Channel Adapters are to be found in I/O endnodes 16, 18, 20, 22 and 24. Host Channel Adapters are configured to issue requests across the fabric 12, and Target Channel Adapters are configured to respond to such requests, for example by supplying requested data or storing supplied data. Each Channel Adapter uses a queuing system based on Queue Pairs, one queue for send operations and one for receive operations. Each Queue Pair may therefore be considered to provide a virtual communication port for a Channel Adapter. Each Channel Adapter may have up to $2^{24}$ Queue Pairs, which may be assigned individually or in combination to handle operations affecting different parts (or consumers) of the endnode 32. For example, a processor node 14 may comprise a plurality of processors, and each processor may have one or more individual Queue Pairs assigned to handle requests and responses flowing to and from that processor of that processor node 14 via the fabric 12. Alternatively, or in addition, a processor of a given processor node 14 may be running more than one process, and each process may have one or more Queue Pairs assigned to handle requests and responses flowing to and from that process via the fabric 12.

Each of the interconnects 28 may be one of three classes, 1x, 4x or 12x, referring to the number of parallel lanes making up that interconnect. Each lane is a single serial connection over a single physical signal carrier path (e.g., electrical or optical). Thus, the bandwidth available to each interconnect is defined by a combination of the number of lanes and the maximum data rate of the physical signal carrier making up each lane.

Figure 2:
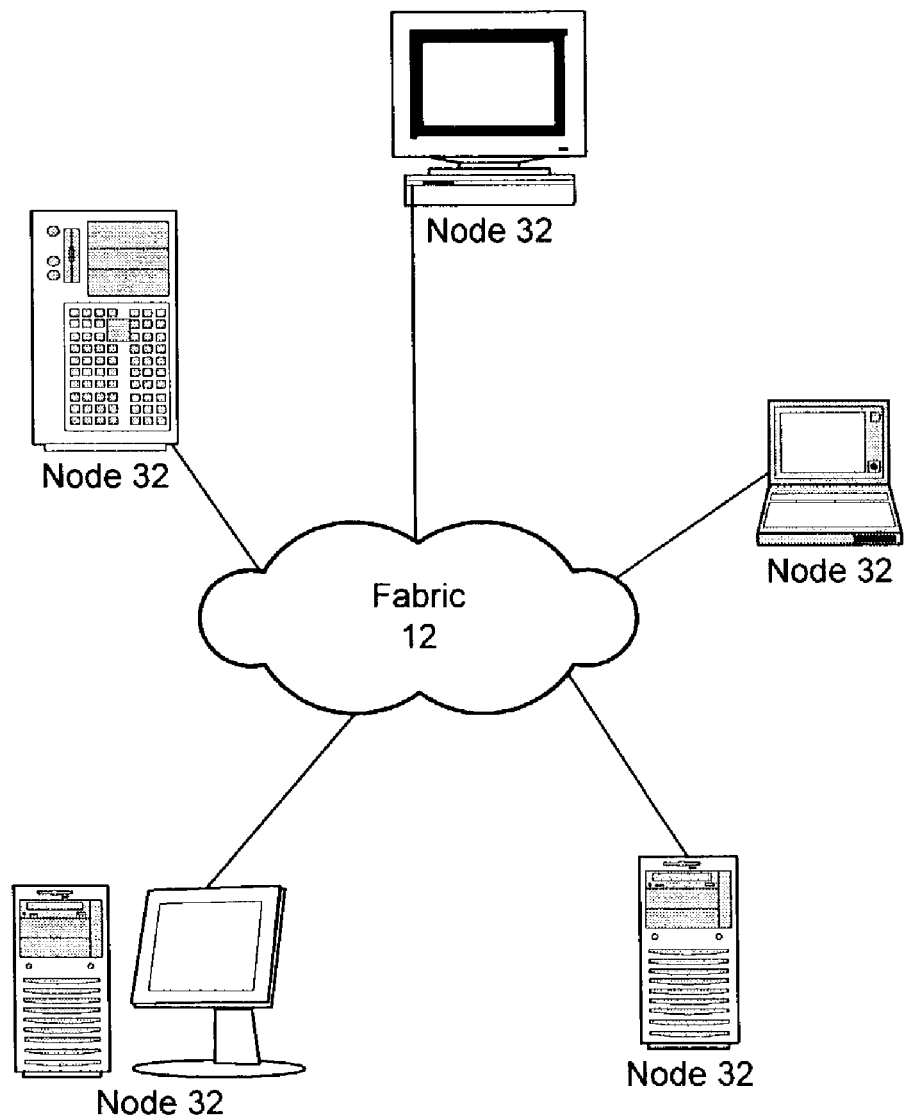
FIG. 2 is a schematic block diagram of a simplified arrangement of an Infiniband™ Architecture system.
Figure 3:
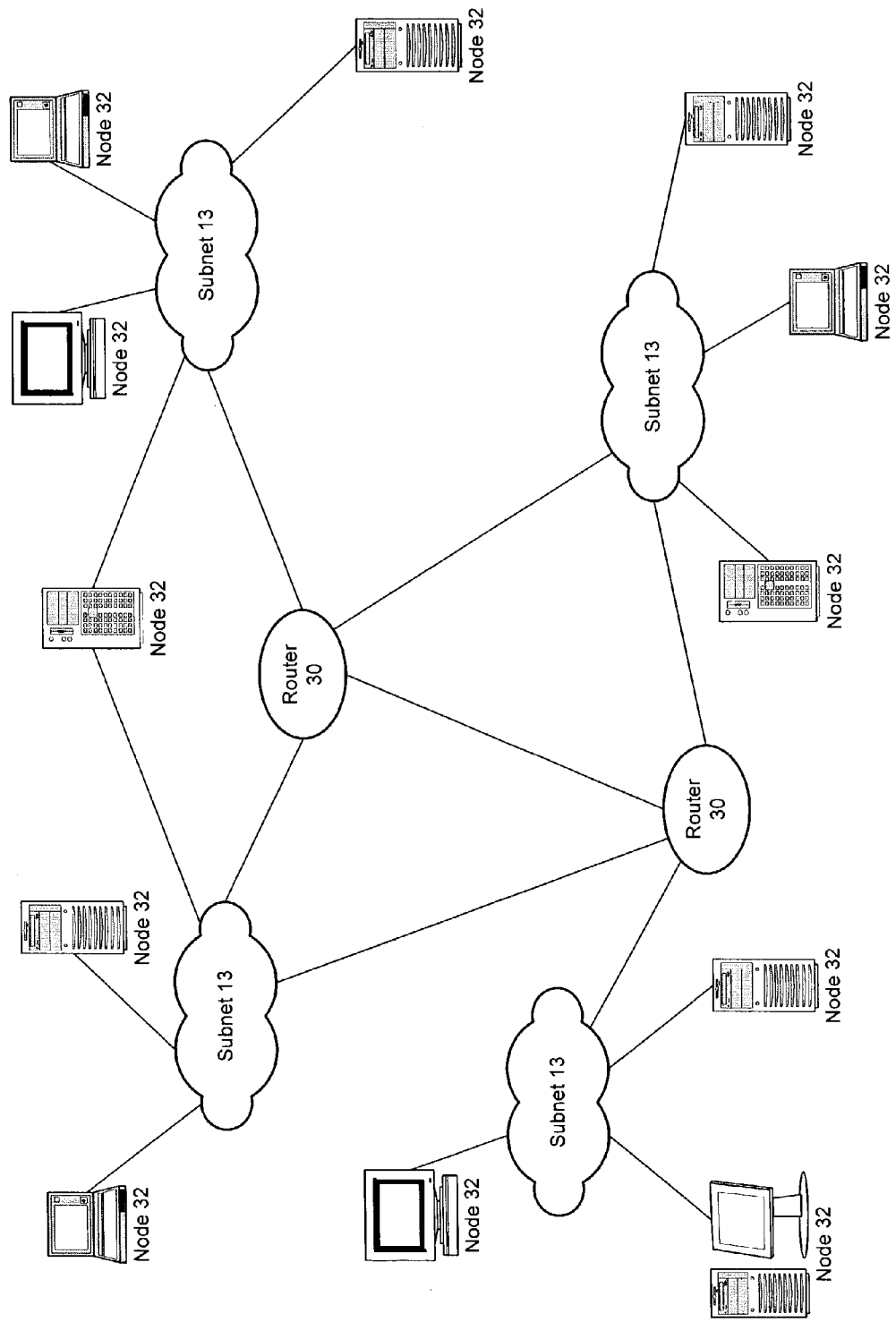
FIG. 3 is a schematic block diagram of another simplified arrangement of an Infiniband™ Architecture system.
Figure 4:
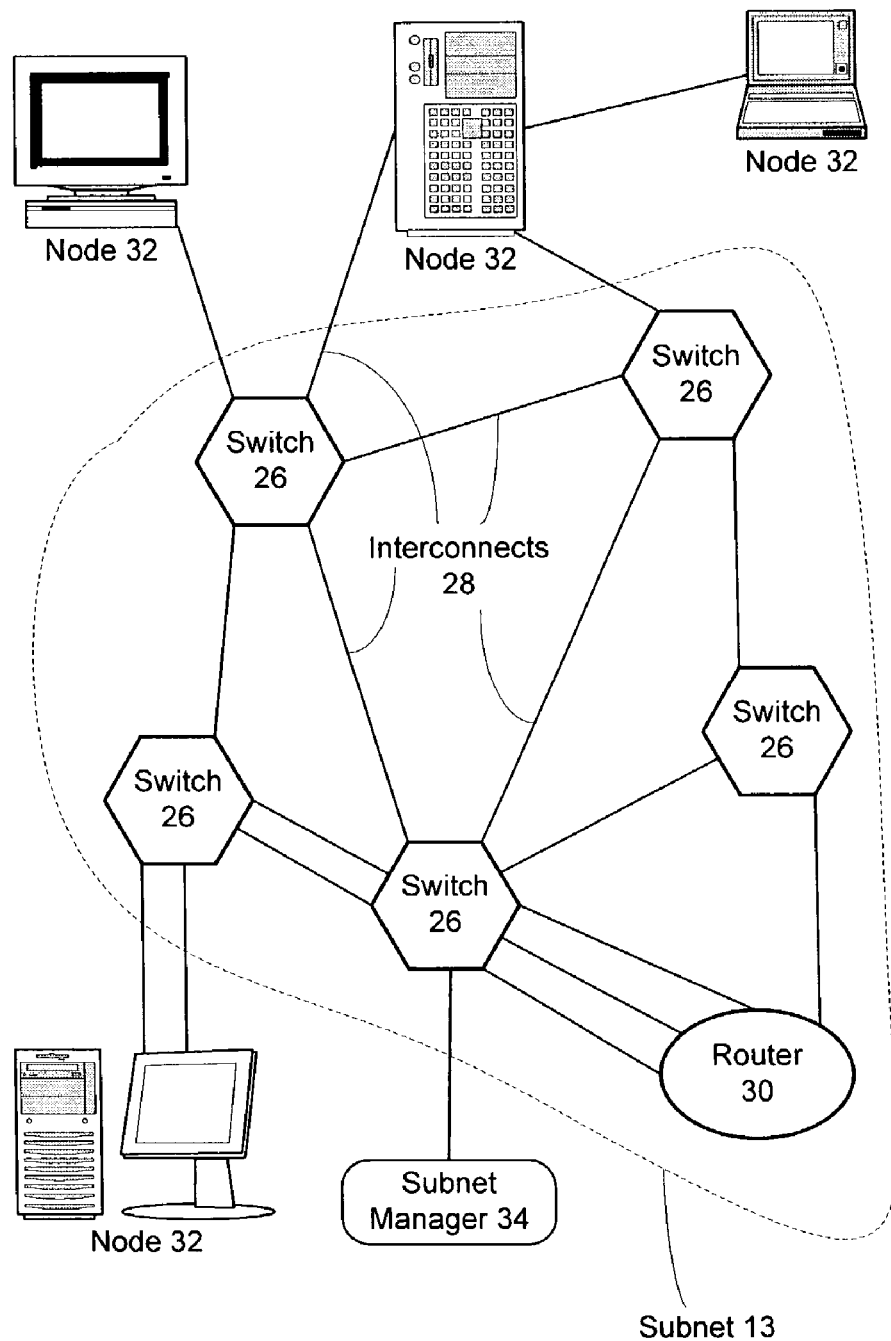
FIG. 4 is a schematic block diagram of a further simplified arrangement of an Infiniband™ Architecture system.

Examples of possible Infiniband™ Architecture topologies are shown in FIGS. 2, 3 and 4. FIG. 2 shows a high level simplified topology example where a number of endnodes 32 are interconnected by the fabric 12. As illustrated in FIG. 3, an Infiniband™ Architecture (IBA) network may be subdivided into subnets 13 interconnected by routers 30. Any particular endnode 32 may be attached to a single subnet 13 or to multiple subnets 13. Shown in FIG. 4 is an example of the structure of a subnet 13. The subnet 13 in FIG. 4 comprises endnodes 32, switches 26, one or more routers 30 and subnet managers 34 interconnected by links 28. Each endnode 32 may attach to a single switch 26, multiple switches 26 and/or directly with each other. In the case of direct connection between endnodes 32, the two or more directly linked endnodes effectively form an independent subnet with no connectivity to the remainder of the devices attached to the main subnet; one of the interconnected endnodes functions as the subnet manager for that link.

Figure 5:
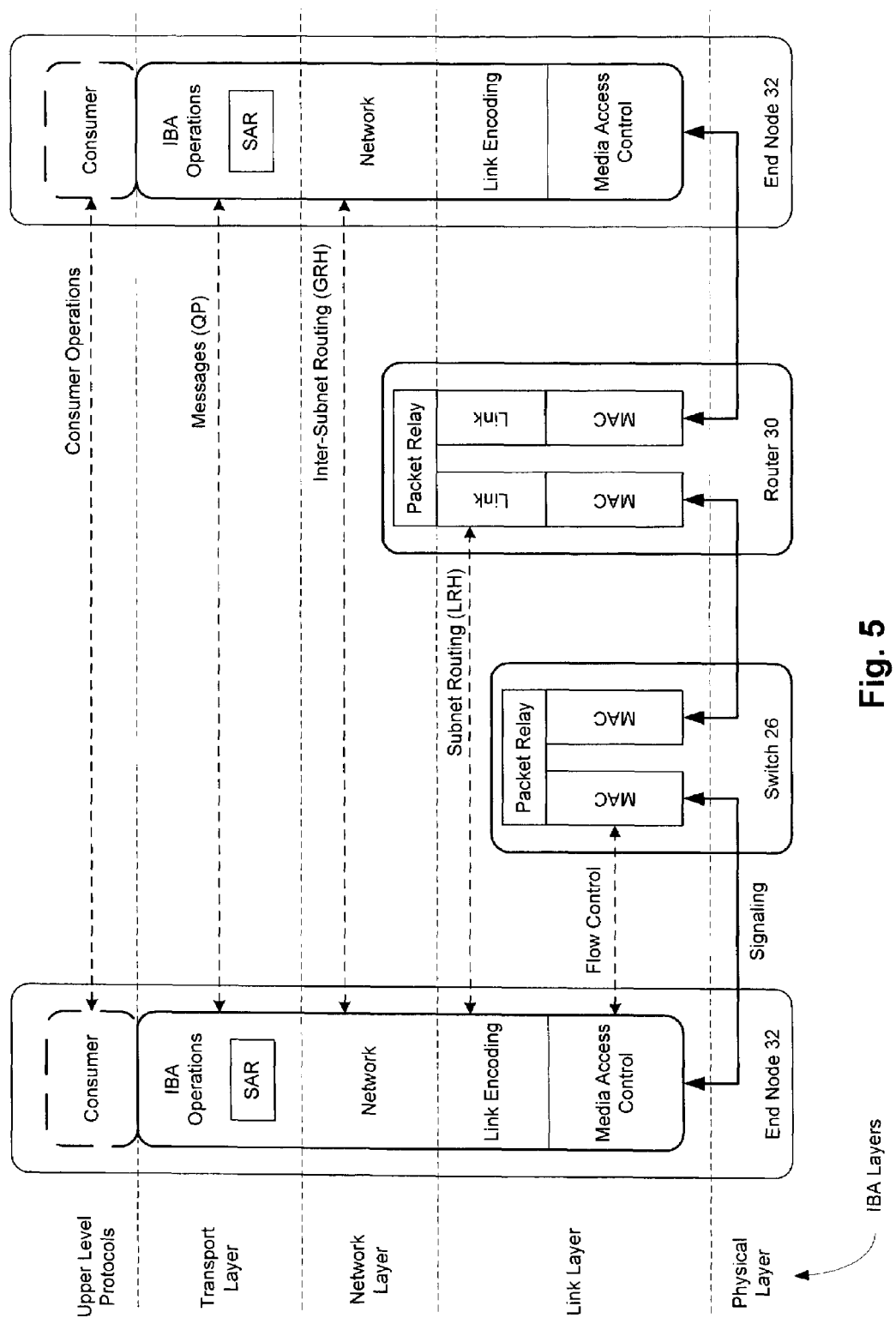
FIG. 5 shows a schematic illustration of the architecture layers of an Infiniband™ Architecture system.

Referring now to FIG. 5, there is shown an illustration of the architecture layers of an Infiniband™ Architecture system. Starting with the physical layer, this specifies how bits are placed onto the interconnections 28 and defines symbols used for framing (e.g., start of packet, end of packet), data symbols and fill between packets (idles). It also specifies the signalling protocol as to what constitutes a validly formed packet (e.g., symbol encoding, proper alignment of framing symbols, no invalid or non-data symbols between start and end delimiter, no disparity errors, synchronisation method). The signalling protocol used by the Infiniband™ Architecture utilises a differential signal. The physical (or ethereal) interconnects 28 between nodes of an Infiniband™ Architecture network are normally provided by electrical signal carriers such as copper cables or optical signal carriers such as optical fibres. As discussed above, the maximum data rate of an interconnect is limited by the bandwidth of the selected channel. The physical layer also includes deskewing circuitry for compensating for skew latency in the channels.

The structure of a message to be transmitted through the fabric 12 via the interconnections 28 is illustrated in FIG. 6. As can be seen from FIG. 6, the message comprises a start delimiter, a packet comprising data symbols, an end delimiter and a number of idles.

The data packet format is illustrated in FIG. 7. Packets may be one of two types, IBA packets or raw (non-Infiniband™ Architecture) packets. IBA packets have IBA defined transport headers, are routed on Infiniband™ Architecture fabrics 12, and use native Infiniband™ Architecture transport facilities. Raw packets may be routed on IBA fabrics, but do not contain Infiniband™ Architecture transport headers. From the Infiniband™ point of view, these packets contain only Infiniband™ routing headers, payload and CRC. Infiniband™ Architecture does not define the processing of these packets above the link and network layers. These packets can be used to support non-Infiniband™ Architecture transports (e.g., TCP/IP, IPX/SPX, NetBUI) over an Infiniband™ fabric.

The Link Layer describes the packet format and protocols for packet operation, such as flow control, how packets are routed within a subnet between the source and the destination, etc. Packets may be data packets that convey data between endnodes and which consist of a number of different headers, which may or may not be present. Alternatively, packets may be Link Management Packets, which are used to train and maintain link operation. These packets are used to negotiate operational parameters between the ports at each end of the link—such as bit rate, link width, etc. The link layer is responsible for flow control handling to prevent the loss of packets due to buffer overflow by the receiver at each end of a link. This mechanism does not describe end-to-end flow control such as might be utilised to prevent transmission of messages during periods when receive buffers are not posted. The terms "transmitter" and "receiver" are utilised to describe each end of a given link. The transmitter is the node sourcing data packets. The receiver is the consumer of the data packets. Each end of the link has a transmitter and a receiver. The Infiniband™ Architecture utilises an "absolute" credit based flow control scheme. In other words, IBA receivers provide a "credit limit". A credit limit is an indication of the total amount of data that the transmitter has been authorised to send since link initialisation.

Credit control is performed by a media access control (MAC) protocol. With respect to a given link, a receiver advertises (by means of a link packet) that credit is available, the amount of which is based on the current status of the receiver's receive buffers. The transmitter receives the link packet and determines how much transmit credit is available from the contents of the link packet. The transmitter then assigns itself the available credit and transmits data packets to the receiver while simultaneously decrementing its available credit count. The transmitter calculates its remaining available credit based on the initial figure determined from the receiver link packet and a record of how much data it has transmitted since that link packet was received.

Errors in transmission, in data packets or in the exchange of flow control information, can result in inconsistencies in the flow control state perceived by the transmitter and receiver. The Infiniband™ Architecture flow control mechanism provides for recovery from this condition. The transmitter periodically sends an indication of the total amount of data that it has sent since link initialisation. The receiver uses this data to re-synchronise the state between the receiver and transmitter.

As can be seen in FIG. 7, the Link Layer adds a Local Route Header (LRH) to the front of the packet and adds Invariant and Variant Cyclic Redundancy Checks (ICRC and VCRC) to the end of the packet. The Local Route Header is always present and identifies the local source and local destination where switches 26 will route the packet. The Invariant Cyclic Redundancy Check covers all fields within the packet that do not change as the message traverses the fabric. The Variant Cyclic Redundancy Check covers all the fields of the packet. The combination of the two CRCs allows switches 26 and routers 30 to modify appropriate fields and still maintain data integrity for the transport control and data portion of the packet.

The Network Layer, which is present only within routers 30 and endnodes 32, describes the protocol for routing a packet between subnets 13. Thus a Global Route Header (GRH) is present in a packet that traverses multiple subnets 13. The Global Route Header identifies the source and destination ports of the message. Routers 30 use the contents of the Global Route Header to determine the forwarding requirements of the message. As the message traverses different subnets 13, the routers 30 modify the content of the Global Route Header and replace the Local Route Header, but the source and destination port identities are not changed and are protected by the Invariant Cyclic Redundancy Check. Thus the Network and Link Layers operate together to deliver a packet to the desired destination.

The Transport Layer, which is present only within endnodes 32, delivers the packet to the proper Queue Pair within the Channel Adapter of the destination endnode 32, and instructs that Queue Pair as to how the packet's data should be processed. The transport layer also has responsibility for segmenting an operation into multiple packets when the message's data payload is greater than the maximum payload that can be carried by a single packet. The receiving Queue Pair then reassembles the data from the multiple packets at the destination endnode 32. The transport layer adds up to two headers to the packet. The Base Transport Header (BTH) is present in all IBA packets but not in raw packets. It identifies the destination Queue Pair and indicates an operation code, packet sequence number and specifies the operation (e.g., Send, Read, Write). A number of Extended Transport Headers (ETH) may be present, depending on the class of service and operation code.

A Packet Sequence Number is initialised for a given Queue Pair as part of the communications establishment process and increments each time that Queue Pair creates a new packet. The receiving Queue Pair tracks the received Packet Sequence Number to determine whether any packets have been lost. For reliable service, the receiver endnode 32 may transmit an acknowledge signal back to the originator endnode to indicate whether all packets have been received successfully.

The Upper Level Protocols are completely software-based, and may comprise any number of protocols used by various user consumers. The Payload field comprises the data carried by the packet, and the I Data field contains handling data associated with a work activity to be performed on the payload. Also present in the Upper Level protocols are Subnet Management and Subnet Services protocols. These protocols provide management structure, including management messages for management of the subnet 13. Each subnet 13 requires only a single Subnet Manager application 34 which may be present in a dedicated node (as illustrated in FIG. 4) or may reside in another node, including a switch 26, a router 30 or an endnode 32.

Figure 8:
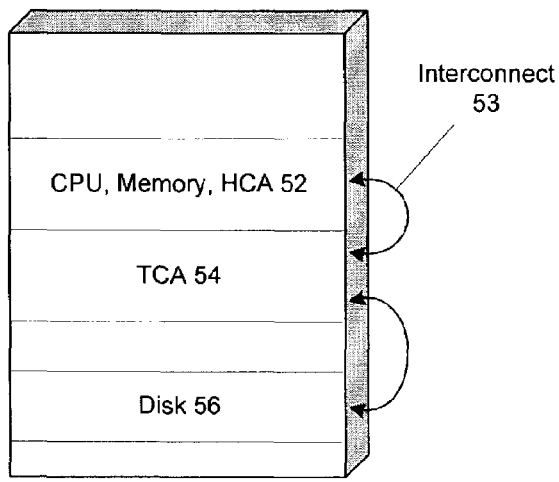
FIG. 8 is a schematic block diagram showing an arrangement where the Infiniband™ Architecture is used to interconnect components within a computer system.
Figure 9:
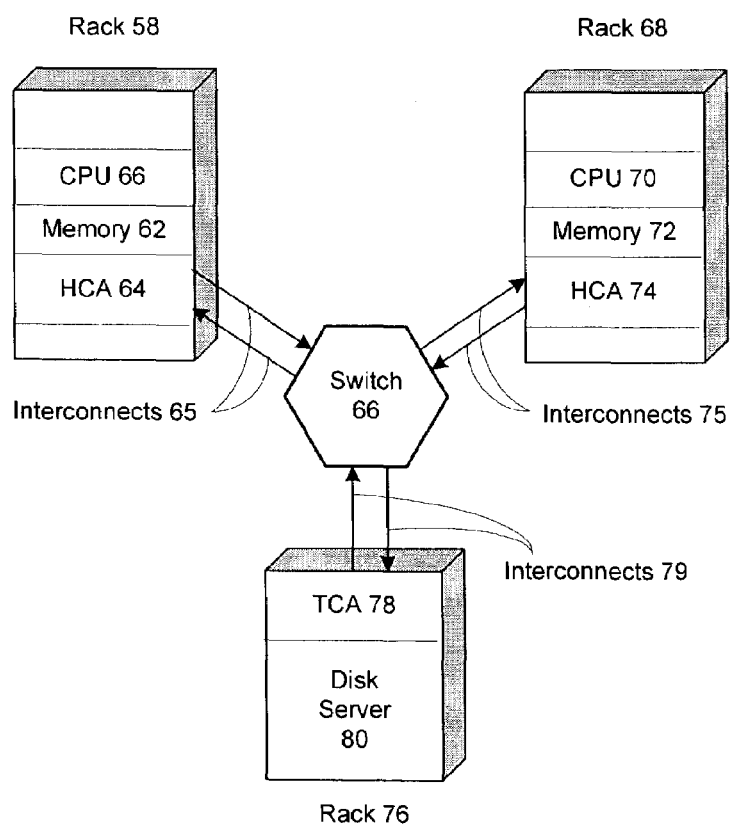
FIG. 9 is a schematic block diagram showing an arrangement where the Infiniband™ Architecture is used as an interconnect between computer systems.

Examples of simple Infiniband™ Architecture systems are shown in FIGS. 8 and 9. FIG. 8 shows an arrangement where the Infiniband™ Architecture is used to interconnect components within a standard computer system rack 50. In this example, the CPU, Memory and a Host Channel Adapter 52 are interconnected using conventional non-Infiniband™ Architecture techniques. The Host Channel Adapter of the CPU, Memory and Host Channel Adapter 52 communicates via an Infiniband™ Architecture interconnect 53 with a Target Channel Adapter 54. The Target Channel Adapter 54 communicates with a disk drive unit 56 via a SCSI (Small Computer System Interface) connection. Thus, the Infiniband™ Architecture is configured in this example to facilitate communications between elements of the same computer system.

FIG. 9 shows an arrangement where the Infiniband™ Architecture is used only as an interconnect between computers. In this example, a first computer system is mounted in a rack 58 and comprises a CPU 60, memory 62 and a Host Channel Adapter 64 interconnected via conventional non-Infiniband™ Architecture techniques. Via the Host Channel adapter 64, the first computer system communicates with a switch 66 across interconnects 65. Also connected to the switch 66 is a second computer system mounted in a rack 68 and comprising a CPU 70, memory 72 and a Host Channel Adapter 74 which connects to the switch 66 via interconnects 75. Data storage for the first and second computer systems is provided by a disk server 80 mounted in a rack 76. The disk server 80 communicates via a Target Channel Adapter 78, also mounted within the rack 76 by conventional non-Infiniband™ Architecture techniques. The Target Channel Adapter 78 connects to the switch 66 via interconnects 79. Thus, the Infiniband™ Architecture is configured in this example to facilitate communication between multiple distinct computer systems. There is no limitation that the techniques of the examples of FIGS. 8 and 9 should be practised separately; a computer system using the Infiniband™ Architecture for internal communications may also be connected to other computer systems via a network based on the Infiniband™ Architecture.

Thus there has now been described an overview of the Infiniband™ Architecture for computer networking with examples of how it may be put into practice. Further details may be found in the above referenced Infiniband™ Architecture Specification Volumes 1 and 2, available from the Infiniband™ Trade Association, the contents of which are hereby incorporated hereinto by reference.

One application of the Infiniband™ architecture described above is distributed simulation. Distributed simulation involves the running of a hardware description language (HDL) simulation on several processors that communicate with each other via a socket connection. These processors may reside on the same computer system or on different computer systems in a computer system group (such as a server farm) or on different computer systems at different locations. Distributed simulation is a scheme primarily used for increasing HDL simulation speed.

In addition to increasing simulation speed, distributed simulation may be used for environment de-coupling. There is often a need when performing development using an HDL to co-simulate an HDL design and its verification environment with HDL models of hardware devices that the HDL design will be connected to in real life. Such HDL models and their verification environments are mostly designed for different purposes, by different teams in a company or by different companies; this creates great compatibility problems. Even if all the HDL models are driven by verification environments written in the same programming language for the same hardware platform and operating system, it is still a non-trivial task to compile the source code together to produce a single executable to run to perform the simulation. The computer systems that are used need to be integrated with one another such that they are able to provide the same simulation environment for the HDL design under test. The use of Infiniband™ to connect the devices permits HDL designs which may or may not be written for some language verification environments to communicate not only with each other but their verification environments as well, thus negating the incompatibility problems described above.

Another feature of distributed simulation is the ability to connect resources across distances greater than a single computer system. Thus, the use of Infiniband™ to perform distributed simulation/verification may result in increased speed and distance capability, as well as a de-coupled simulation environment.

Figure 10:
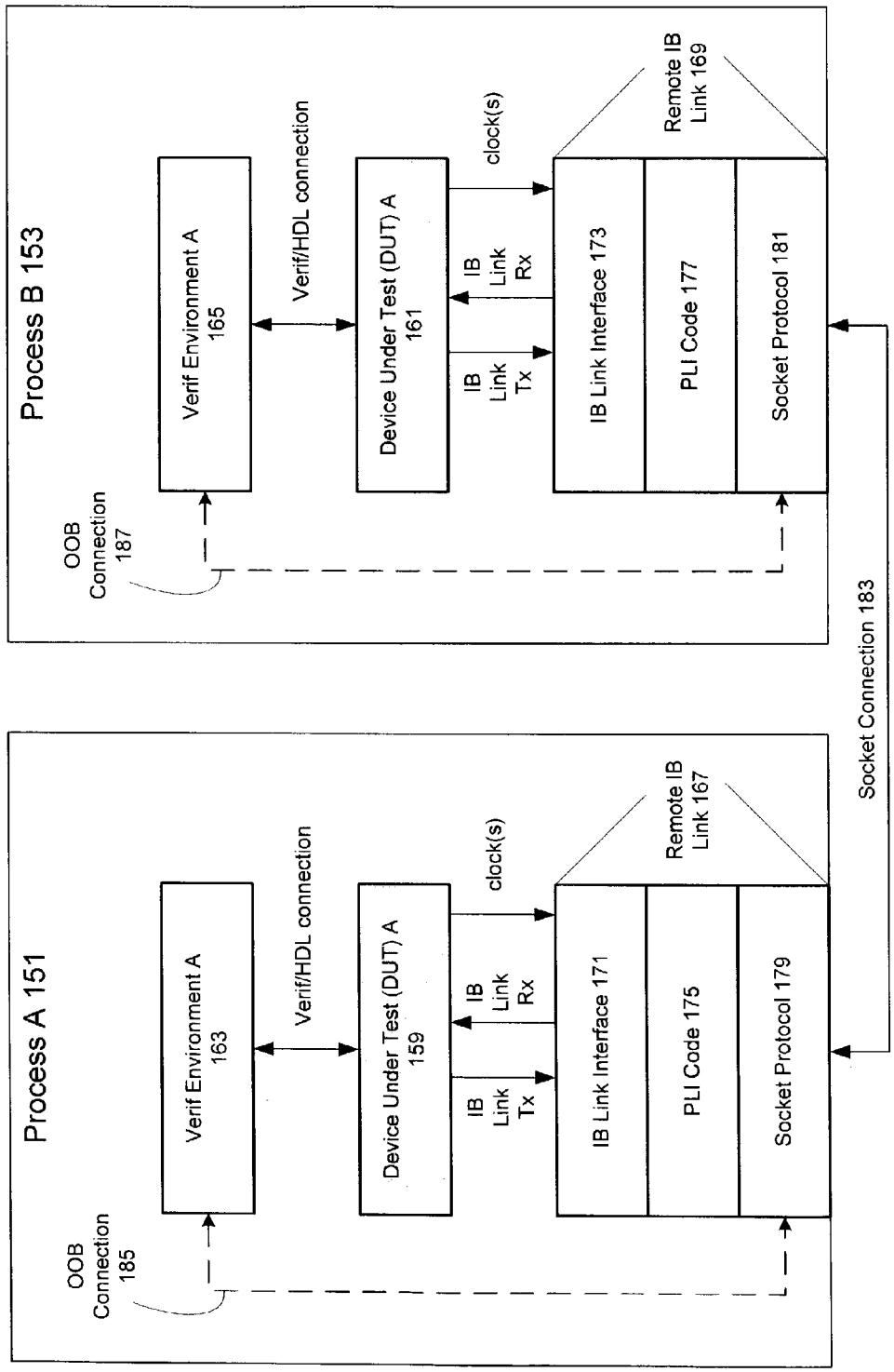
FIG. 10 is a schematic block diagram showing the structure of a verification arrangement of the present invention.

Shown in FIG. 10 is a schematic overview of a distributed Infiniband™ verification protocol. Two processes, Process A 151, and Process B 153, are each arranged to perform simulation of an HDL design, which is the device under test (DUT) 159 and 161. Each process contains a verification environment, 163 and 165 respectively. The present example will be described with reference to a particular hardware development language, namely Verilog™ HDL. Each process also contains a remote Infiniband™ (IB) link 167 and 169 respectively. The remote Infiniband™ link contains Verilog™ HDL code describing an Infiniband™ link interface 171 and 173 respectively, programming language interface (PLI) code 175 and 177 respectively, and a socket protocol 179 and 181 respectively, all written in C code to be compatible with the Verilog™ specifications. The remote Infiniband™ links 167 and 169 are independent of the devices under test 159 and 161 and the verification environments 163 and 165. Out of band (OOB) connections 185 and 187 do, however, need support within the verification environment code 163 and 165, and will be described later.

The device under test 159 and 161 of each process 151 and 153 is a simulation of an HDL design for which verification or test data is required. Each device under test 159 and 161 includes HDL code describing the module that is to be tested, HDL code setting up an interface for communication with the respective verification environment 163 and 165, and HDL code describing an Infiniband™ interface such that each device under test 159 and 161 is operable to communicate via an Infiniband™ link.

The device under test 159 and 161 is set up within each process 151 and 153, respectively, to communicate with the Infiniband link interface 171 using the built-in Infiniband™ interface programmed into the device under test. Thus, each remote Infiniband link 167 and 169 is operable to communicate with its local device under test 159 and 161, respectively, without knowledge of the HDL language used to produce the device under test 159 and 161 and without any knowledge of the language in which the respective verification environment 163 and 165 is written.

The basic operation of the system shown in FIG. 10 is that the verification environment 163 of process A 151 sends stimuli to its device under test 159 which produces an output in response to the stimuli. The output is transformed into Infiniband™ physical layer cycles by the Infiniband™ interface written into the device under test 159. These cycles are sampled by the Infiniband™ link interface 171. When the cycle count reaches a pre-set number, the Infiniband™ link interface 171 indicates that the predetermined count is complete, so as to cause the simulator to call a programming layer interface routine activating the socket protocol 179. Control of the program flow is passed to the socket protocol such that the simulator waits until this call returns. Thus, simulation time does not advance while the socket protocol 179 is executing. The socket protocol 179 reads the sampled cycles from the Infiniband™ link interface 171 by use of programming language interface 175 calls, packs them into a pre-defined data structure (packet), fills in the header of the data structure and sends it to the other side of socket connection 183, which in the present example is a TCP/IP based network although any socket protocol may be used. Following transmission of the data structure, the socket protocol code 179 executes a read on the socket and waits until the other side of the socket connection 183 sends a data structure of the same type. Upon reading the data structure, it decodes the information contained in the header of the structure. Depending on the information in the header it undertakes an action.

The data structure transmitted over the socket connection 183 from the socket protocol 179 of process A 151 is received by the socket protocol 181 of process B 153. The socket protocol 181 unpacks the data structure to retrieve the sampled cycles from Process A's device under test 159. The sampled cycles are then passed to the Infiniband™ link interface 173 using PLI code 177. The Infiniband™ link interface 173 transmits the sampled cycles to Process B's device under test 161, which performs processing on the sampled cycles according to the programming of the design. The result of this processing is then passed to verification environment 165 or back to the Infiniband™ link interface 173 for transmission to process A according to the programming of the design.

The socket protocol 181 may transmit a data structure back to the socket protocol 179 instructing process A to continue until a further cycle count is completed, or it may transmit a data structure containing sampled cycles from process B for process A to perform processing on. Such communications between processes A and B may continue for the duration of the test.

The data structure used in transmissions across the socket connection 183 comprises a header, a cycle buffer and a message buffer. A single socket connection data structure can contain Infiniband™ cycles only, out of band messages only or both.

The header of the data structure includes fields to record the cycle size, the message size, the message type and the message address. The cycle size and message size parameters are used to indicate what the contents of the data structure are (i.e., Infiniband™ cycles, out of band message, both). If the cycle size is non-zero, then the socket protocol code 179 or 181 always returns control to the simulator 155 or 157 respectively after reading the socket and transferring the cycle values just received from the socket to the Infiniband™ link interface 171 or 173 respectively. If this is the only functionality that is required from the receiver Infiniband™ link, then the verification environment 163 and 165 does not even need to know of the existence of the receiver Infiniband™ link, and will only interact with the device under test 159 or 161 in band on the Verif/HDL connection shown in FIG. 10. The remote Infiniband™ link 167 and 169 needs to know the IP address and the port number of the remote Infiniband™ link 167 and 169 to which it is connected. This information and the number of cycles that will be sampled and transferred by the socket are established as part of an initial configuration.

Out of band communication takes place when a verification environment 163 or 165 needs to communicate with other units in the Infiniband™ subnet without using the devices under test 159 and 161. An example of a subnet is the fabric 12 illustrated and described with reference to FIG. 1. A full definition of a subnet is given in Volume 1 of the Infiniband™ Architecture specification. This occurs, for example, when one verification environment 163 needs to communicate with another verification environment 165. Such direct communication between verification environments is necessary to ensure that both know what data is to be sent during a test, so that any corruptions introduced during a test can be detected. Corruptions may be introduced during a test by bugs within one or more designs under test. The bugs need to be detected in order that the designs can be modified to eliminate the bugs. Alternatively, out of band communication may be required for receiving send/received commands from an endnode within a subnet. Each verification environment 163 and 165 performs out of band communication through its respective OOB connection 185 and 187 to the respective local remote Infiniband™ link 167 and 169. Each verification environment has support routines written in socket protocol code 175 and 177 to perform this action. All IP addresses and port numbers of remote nodes that the verification environments 163 and 165 will exchange messages with will be provided to the remote Infiniband™ links 167 and 169 upon initial configuration.

Two types of out of band messages may be sent to the remote Infiniband™ link 167 and 169 from a verification environment 163 or 165. The first such message is a capability message. Capabilities are a set of methods defined by the Infiniband™ architecture compliance committee. Compliance Tests which are also defined by the same committee are built on these capabilities. Capabilities may be considered test primitives that apply a stimulus to the device under test 159 and 161 and verify values obtained from the device under test. If a verification environment 163 or 165 intends to send out of band messages to a node in the subnet, it is expected that this node supports standard capability messages. This scheme will enable a single node, most likely a host channel adapter or a terminal channel adapter, to direct a flow of events within the subnet. The nodes may run only their own stimuli but they may use capability messages to let the receiving node expect a certain packet within a given time-out value.

The second form of message is the capability return values message. If a capability returns a value, then this value may either be sent immediately without advancing simulation time or it may be sent with the next sample cycles. While the latter case is more effective for saving time used on the socket communication, the immediate transfer may be used to measure in-band packet latency by the receiver. Something which must be taken into account is that to some extent, the receive and transmit parts of an Infiniband™ port are independent of each other. Thus, several Infiniband™ link cycles can be sent by single socket transfer. As long as the maximum skip ordered set interval of 4608 cycles is satisfied, any number of Infiniband™ link cycles can be sampled and sent over to the other side of the remote Infiniband™ link 167 and 169. Transporting Infiniband™ cycles between remote Infiniband™ links can be seen as driving very long Infiniband™ wires that can pipeline several cycles. That is, given that the transmission time through a cable (even optical fibre) may be long relative to the Infiniband™ cycle time, a number of bits may "enter" the cable before the first of those bits "exits" at the other end. Thus the cable operates as a pipeline transporting bits between the two remote Infiniband™ links.

Socket communication is generally a slow process; however, HDL simulators and PLI connections are also slow. Thus the slowness of socket communication is found to offer no additional disadvantage. In addition, the size of data packets transported across the remote Infiniband™ link may compensate in some way for the time spent using the socket connection 183.

In test situations where thousands of parallel events are to be executed by the HDL simulator 155 and 157 that is simulating a hardware design and by the connected verification environment 163 and 165, the computational load may be too heavy to run on a single processor. There is no performance benefit provided by using several processors on a single computer that runs the entire simulation load in a single process. In addition to the potentially overwhelming number of events scheduled for execution, a working set of the process may be too large to hold in physical memory during simulation. This may cause extensive access to secondary storage such as hard disk storage.

A solution to this problem is to partition the HDL design into smaller units and run each unit on a different processor, so that several processes may be assigned to the units. Connections between these different processes are implemented using socket connections. Infiniband™ architecture devices such as host channel adapters, terminal channel adapters or switches that connect to each other in a subnet model are well suited to this kind of partitioning. Even if the socket connection itself is relatively slow, the overhead introduced by the use of the socket connection will pay off if the following inequality is satisfied:

$$\Sigma Un+Mn>U\max+M+So$$

A unit U is defined as a host channel adapter, a terminal channel adapter or a switch model and its verification environment. In the equation, U is process or time for unit users to execute a given number of Infiniband™ link cycles, M is time consumed in accessing secondary memory per unit, Umax is the largest unit process or time and So is socket overhead. While processor speed and physical memory size may vary from one computer system to another, communication speed over a network may in general be constant. On the other hand, the working set of a single unit may be small enough to avoid swapping it out to secondary memory such that the "M" term may be eliminated altogether. Given the state of technology in which a local area network (LAN) can transfer TCP packets within fractions of a millisecond, any access to secondary memory will cause the inequality above to be satisfied.

In the context of FIG. 1 above, the Distributed Infiniband™ Verification Environment Protocol arrangement described above may be substituted into the fabric by replacing any of the endnode⇌switch, switch⇌switch, or switch⇌router Infiniband™ links with a pair of remote Infiniband™ links and an associated socket connection.

Thus there has now been described a system for distributed verification wherein test devices written for different verification environments may be tested together without any incompatibility problems caused by the mutually differing nature of the verification environments used. Also, the speed of performing the tests may be accelerated and the distance over which the verification exercise may take place is effectively unlimited. All of these improvements are brought about by using the Infiniband™ protocol for communication between the device under test and a socket protocol link for communication with a second process. As will be appreciated, many modifications and alternatives to the above-described example may be made without departing from the scope of the present invention as claimed in the appended claims.

The OOB connection described above with reference to FIG. 10 gives rise to further operational possibilities. If an OOB connection is installed between a verification environment and its respective remote Infiniband link, then that verification environment may be used to send Infiniband link cycles to the other process without those cycles passing through the device under test. Therefore, a process may omit a device under test altogether.

Applications for this arrangement include the following. Firstly, a verification environment may be used to drive a remote device under test and its associated verification environment from a local verification environment. This arrangement allows a device under test to be verified according to a test suite written on a verification environment remote from the device under test's local environment, which test suite is not operable within the device under test's local environment. For this situation, there is no requirement for the device under test's local environment to be equipped with an OOB connection.

Secondly, this arrangement may be used for verification of the verification environments themselves against each other. For this situation, the OOB functionality in the verification environments is operable such that a verification environment may send and receive Infiniband link cycles directly from the socket protocol, so that no hardware development language coding or translation is required. As will be appreciated, neither process need have a device under test for this configuration.

As will be appreciated, although it has been described above with reference to FIG. 10 that the particular hardware description language Verilog™ HDL is used in the example, there is not limitation on what hardware description language may be used. An example of an alternative HDL is VHDL (Very High Speed Integrated Circuit HDL). The routines of the remote Infiniband™ link must however be written in such a language as to be compatible with the chosen hardware description language in order to achieve the de-coupled simulation environment.

Although it has been described above with reference to FIG. 10 that an Infiniband link interface is present between each device under test and the PLI code of its respective Infiniband link, this is not essential and some or all linked processes may omit the Infiniband link interface. In this situation, the device under test will be programmed to be operable to communicate directly with the PLI code.

What is claimed is:

1. A verification process comprising:
   a verification environment comprising a hardware development language interface;
   a device under test, comprising:
      a hardware development language interface operable to receive a signal from the verification environment hardware development language interface; and
      an Infiniband interface; and
   a remote Infiniband link, comprising:
      an Infiniband interface operable to receive a signal from the device under test Infiniband interface; and
      a socket protocol interface operable to transmit a signal to another verification process.

2. The verification process of claim 1, wherein the verification environment is operable to provide a signal comprising a stimulus to the device under test via the hardware development language interface.

3. The verification process of claim 1, wherein the device under test further comprises a test design for an integrated circuit.

4. The verification process of claim 1, wherein the device under test is operable to perform processing on a received signal in accordance with a predetermined test parameter.

5. The verification process of claim 4, wherein the device under test is operable to transmit a result of the processing to the remote Infiniband link via the Infiniband interface.

6. The verification process of claim 1, wherein the remote Infiniband link comprises programming language interface routines to control transfer of data signals between the remote Infiniband link Infiniband interface and the remote Infiniband link socket protocol interface.

7. The verification process of claim 1, wherein the verification environment comprises an out of band communication interface operable to communicate with the remote Infiniband link via an out of band communication interface of the remote Infiniband link.

8. The verification process of claim 1, wherein the remote Infiniband link socket protocol interface is a TCP/IP interface.

9. The verification process of claim 1, wherein the device under test is written in a hardware development language.

10. The verification process of claim 9, wherein the hardware development language is Verilog™ HDL.

11. The verification process of claim 9, wherein the hardware development language is VHDL.

12. The verification process of claim 1, wherein:
the device under test is written in a hardware development language; and
the hardware development language of the device under test of the verification process is the same as a hardware development language of a device under test of the other verification process.

13. The verification process of claim 1, wherein:
the device under test is written in a hardware development language; and
the hardware development language of the device under test of the verification process is different from a hardware development language of a device under test of the other verification process.

14. A distributed simulation environment, comprising:
a first verification process, comprising:
 a verification environment comprising a hardware development language interface;
 a device under test, comprising
  a hardware development language interface operable to receive a signal from the verification environment hardware development language interface; and
  an Infiniband interface; and a remote Infiniband link, comprising:
  an Infiniband interface operable to receive a signal from the device under test Infiniband interface; and
  a socket protocol interface operable to transmit a signal to another verification process;
a second verification process; and
a socket connection arranged to connect the remote Infiniband link socket protocol interface of each verification process.

15. The distributed simulation environment of claim 14, wherein:
the verification environment of the first verification process is operable to transmit a signal comprising a stimulus to the device under test of the first verification process;
the device under test of the first verification process is operable to transmit a result of processing applied to the stimulus by the device under test of the first verification process to the remote Infiniband link of the first verification process;
the remote Infiniband link of the first verification process is operable to transmit the result via the socket connection;
a remote Infiniband link of the second verification process is operable to receive the result and to transmit the result to a device under test of the second verification process; and
the device under test of the second verification process is operable to apply processing to the result to produce a further result.

16. The distributed simulation environment of claim 15, wherein the device under test of the second verification process is operable to transmit the further result to the verification environment of the second verification process.

17. The distributed simulation environment of claim 15, wherein the device under test of the second verification process is operable to transmit the further result to the remote Infiniband link of the second verification process for transmission to the first verification process.

18. The distributed simulation environment of claim 14, wherein the first and second verification processes are co-located.

19. The distributed simulation environment of claim 14, wherein the first and second verification processes are in different locations.

20. The distributed simulation environment of claim 14, wherein the first and second verification processes are located within different territories.

21. The distributed simulation environment of claim 14, further comprising a third verification process, connected to at least one of the first and second verification processes via the socket connection.

22. A method of distributed testing of a hardware design, the method comprising:
within a first verification process:
 providing a stimulus to a first part of the design to produce an initial result;
 transmitting the initial result via a first Infiniband interface to a first socket connection interface of the first verification process; and
 transmitting the initial result via a socket connection from the first socket connection interface to a second socket connection interface of a second verification process; and
within the second verification process:
 transmitting the initial result from the second socket connection interface to a second Infiniband interface;
 transmitting the initial result from the second Infiniband interface to a second part of the design; and
 processing the initial result at the second part of the design to produce a further result.

23. The method of claim 22, wherein the first part of the design, the first Infiniband interface and the first socket connection interface are comprised in the first verification process.

24. The method of claim 22, wherein the second socket connection interface, the second Infiniband interface and the second part of the design are comprised in the second verification process.

25. The method of claim 23, wherein:
the second socket connection interface, the second Infiniband interface and the second part of the design are comprised in a second process; and
the first process and the second process are performed at a common location.

26. The method of claim 23, wherein:
the second socket connection interface, the second Infiniband interface and the second part of the design are comprised in a second process; and
the first process and the second process are performed at separate locations.

27. The method of claim 22, further comprising generating the stimulus at a first verification environment.

28. The method of claim 27, further comprising receiving the further result at a second verification environment, wherein the first verification environment and second verification environment are the same verification environment.

29. The method of claim 27, further comprising receiving the further result at a second verification environment, wherein the first verification environment and second verification environment are different verification environments.

30. The method of claim 22, further comprising receiving the further result at a second verification environment.

31. The method of claim 22, wherein the first and second parts of the design are written in a hardware development language.

32. The method of claim 31, wherein the first and second parts of the design are written in the same hardware development language.

33. The method of claim 31, wherein the first and second parts of the design are written in different hardware development languages.

34. The method of claim 31, wherein the hardware development language of at least one of the first and second parts of the design is Verilog™ HDL.

35. The method of claim 31, wherein the hardware development language of at least one of the first and second parts of the design is VHDL.

36. The method of claim 22, further comprising:
transmitting a message from a first verification environment to the first socket connection interface;
transmitting the message from the first socket connection interface to the second socket connection interface; and
transmitting the message from the second socket connection interface to a second verification environment.

37. The method of claim 36, wherein the message describes an expected further result.

38. The method of claim 36, wherein the message is an Infiniband capability message.

39. The method of claim 36, wherein the message is an Infiniband capability response message.

40. The method of claim 36, wherein the message is transmitted from the first socket connection interface to the second socket connection interface using a data structure comprising the initial result.

41. The method of claim 36, wherein the message is transmitted from the first socket connection interface to the second socket connection interface using a dedicated data structure.

42. The method of claim 22, wherein a verification environment comprises the first part of the design.

43. The method of claim 22, wherein a verification environment comprises the second part of the design.

44. A method of distributed testing of a hardware design, the method comprising:
within a first verification process:
a step of providing a stimulus to a first part of the design to produce an initial result;
a step of transmitting the initial result via a first Infiniband interface to a first socket connection interface of the first verification process;
a step of transmitting the initial result via a socket connection from the first socket connection interface to a second socket connection interface of a second verification process; and
within the second verification process:
a step of transmitting the initial result from the second socket connection interface to a second Infiniband interface;
a step of transmitting the initial result from the second Infiniband interface to a second part of the design; and
a step of processing the initial result at the second part of the design to produce a further result.

45. A method of remote testing of a hardware design, the method comprising:
within a first verification process:
generating a stimulus to be provided to the design;
transmitting the stimulus via a first Infiniband interface to a first socket connection interface of the first verification process;
transmitting the initial result via a socket connection from the first socket connection interface to a second socket connection interface of a second verification process; and
within the second verification process:
transmitting the initial result from the second socket connection interface to a second Infiniband interface;
transmitting the stimulus from the second Infiniband interface to the design; and
processing the stimulus at the design to produce a test result.

46. A distributed simulation environment comprising:
a first verification process comprising:
a verification environment comprising an Infiniband interface; and
a socket protocol interface operable to receive a signal from the verification environment and to transmit the signal to a further verification process;
a second verification process comprising:
a device under test comprising an Infiniband interface, wherein the device under test is operable to receive a signal from the Infiniband interface; and
a socket protocol interface operable to receive a signal from a second verification process and transmit the signal to the device under test;
and
a socket connection arranged to connect the socket protocol interface of the first verification process and the second verification process.

* * * * *

UNITED STATES PATENT AND TRADEMARK OFFICE
CERTIFICATE OF CORRECTION

PATENT NO. : 7,051,304 B2 Page 1 of 2
APPLICATION NO. : 10/428368
DATED : May 23, 2006
INVENTOR(S) : Ali Bozkaya et al.

It is certified that error appears in the above-identified patent and that said Letters Patent is hereby corrected as shown below:

In claim 14 (at column 13, lines 19-30), replace

"a device under test, comprising
    a hardware development language interface operable
        to receive a signal from the verification environment
        development language interface;
        and
an Infiniband interface; and a remote Infiniband link,
    comprising:
an Infiniband interface operable to receive a signal from the
    device under test Infiniband interface;
    and
a socket protocol interface operable to transmit a
    signal to another verification process;"

with

--a device under test, comprising
    a hardware development language interface operable
        to receive a signal from the verification environment
        development language interface;
        and
    an Infiniband interface; and
a remote Infiniband link, comprising:
    an Infiniband interface operable to receive a signal
        from the device under test Infiniband interface;
        and

UNITED STATES PATENT AND TRADEMARK OFFICE
CERTIFICATE OF CORRECTION

| | |
|---|---|
| PATENT NO. | : 7,051,304 B2 |
| APPLICATION NO. | : 10/428368 |
| DATED | : May 23, 2006 |
| INVENTOR(S) | : Ali Bozkaya et al. |

It is certified that error appears in the above-identified patent and that said Letters Patent is hereby corrected as shown below:

a socket protocol interface operable to transmit a
      signal to another verification process;--

Signed and Sealed this

Twenty-second Day of August, 2006

JON W. DUDAS
*Director of the United States Patent and Trademark Office*